(12) United States Patent
Koike

(10) Patent No.: US 7,691,279 B2
(45) Date of Patent: Apr. 6, 2010

(54) METHOD OF PRODUCING A GLASS SUBSTRATE FOR A MASK BLANK AND METHOD OF PRODUCING A MASK BLANK

(75) Inventor: Kesahiro Koike, Tokyo (JP)

(73) Assignee: Hoya Corporation, Tokyo (JP)

( * ) Notice: Subject to any disclaimer, the term of this patent is extended or adjusted under 35 U.S.C. 154(b) by 753 days.

(21) Appl. No.: 10/809,419

(22) Filed: Mar. 26, 2004

(65) Prior Publication Data

US 2004/0192063 A1 Sep. 30, 2004

(30) Foreign Application Priority Data

Mar. 27, 2003 (JP) ............................. 2003-087798

(51) Int. Cl.
*C03C 15/00* (2006.01)
*G03F 9/00* (2006.01)
*B44C 1/22* (2006.01)

(52) U.S. Cl. ............................. 216/84; 216/31; 216/52; 216/88; 216/89; 216/97; 438/692; 438/693

(58) Field of Classification Search ............... 430/5; 65/472, 31, 377; 438/944, 692, 693; 216/24, 216/26, 57, 59, 67, 80, 84, 88, 97, 531

See application file for complete search history.

(56) References Cited

U.S. PATENT DOCUMENTS

| | | | | |
|---|---|---|---|---|
| 2,372,536 | A * | 3/1945 | Walker ........................ | 216/84 |
| 6,015,640 | A * | 1/2000 | Cardinale ..................... | 430/5 |
| 6,465,272 | B1 * | 10/2002 | Davis et al. ................... | 438/72 |
| 6,544,893 | B2 | 4/2003 | Eto | |
| 6,855,908 | B2 * | 2/2005 | Takeuchi et al. ......... | 219/121.4 |
| 6,858,537 | B2 * | 2/2005 | Brewer ...................... | 438/692 |
| 6,861,659 | B2 * | 3/2005 | Tanabe ..................... | 250/559.4 |
| 6,869,732 | B2 * | 3/2005 | Takeuchi et al. .............. | 430/5 |
| 6,908,713 | B2 * | 6/2005 | Silverman ..................... | 430/5 |
| 6,928,837 | B2 * | 8/2005 | Takeuchi et al. ........... | 65/29.18 |
| 6,951,502 | B2 * | 10/2005 | Koike et al. .................... | 451/8 |

(Continued)

FOREIGN PATENT DOCUMENTS

EP 1 251 108 A1 10/2002

(Continued)

OTHER PUBLICATIONS

Japanese Office Action Jul. 14, 2009.

*Primary Examiner*—Shamim Ahmed
(74) *Attorney, Agent, or Firm*—Sughrue Mion, PLLC

(57) ABSTRACT

A method of producing a glass substrate for a mask blank has the steps of measuring a convex/concave profile of a surface of the glass substrate, controlling a flatness of the surface of the glass substrate to a value not greater than a predetermined reference value by specifying the degree of convexity of a convex portion present on the surface of the glass substrate with reference to a result of measurement obtained in the profile measuring step and executing local machining upon the convex portion under a machining condition depending upon the degree of convexity, and polishing, after the flatness control step, the surface of the glass substrate subjected to the local machining. The surface of the glass substrate subjected to the local machining is subjected to acid treatment after the flatness control step and before the polishing step.

19 Claims, 4 Drawing Sheets

U.S. PATENT DOCUMENTS

| | | | |
|---|---|---|---|
| 2002/0043080 A1* | 4/2002 | Best et al. .................... | 65/61 |
| 2002/0157421 A1* | 10/2002 | Ackerman et al. ........... | 65/17.6 |
| 2002/0179576 A1* | 12/2002 | Takeuchi et al. ....... | 219/121.41 |
| 2004/0035153 A1* | 2/2004 | Koike et al. .................... | 65/61 |
| 2004/0137828 A1* | 7/2004 | Takahashi et al. ............. | 451/41 |
| 2004/0192171 A1* | 9/2004 | Koike ........................... | 451/5 |
| 2005/0186691 A1* | 8/2005 | Koike et al. ................... | 438/14 |

FOREIGN PATENT DOCUMENTS

| | | |
|---|---|---|
| JP | 63-114866 A | 5/1988 |
| JP | 64-40267 A | 2/1989 |
| JP | 8-293483 A | 11/1996 |
| JP | 9295833 A | 11/1997 |
| JP | 11167195 A | 6/1999 |
| JP | 11-242001 A | 9/1999 |
| JP | 2002-316835 A | 10/2002 |

* cited by examiner

METHOD OF PRODUCING A GLASS SUBSTRATE FOR A MASK BLANK AND METHOD OF PRODUCING A MASK BLANK

This invention claims priority to prior Japanese application JP 2003-87798, the disclosure of which is incorporated herein by reference.

BACKGROUND OF THE INVENTION

This invention relates to a method of producing a glass substrate for a mask blank and a method of producing a mask blank and, in particular, to a method of producing a glass substrate for a mask blank for use with light in an ultrashort wavelength range, such as F2 excimer laser (fluorine: having a wavelength of 157 nm) and EUV light (extreme ultra violet: having a wavelength of 13 nm), as an exposure light source and a method of producing a mask blank of the type.

Following the improvement of a ULSI device having a higher density and a higher accuracy in recent years, a glass substrate for a mask blank is required to have a substrate surface of a finer structure. Such tendency towards the finer structure of the substrate surface becomes more and more accelerated year by year. In particular, as an exposure light source of a shorter wavelength is used, the demand for a profile accuracy (flatness) and a quality (defect size) of the substrate surface becomes strict. Thus, the glass substrate for a mask blank is required to have an extremely high flatness and to be free from a microscopic defect.

For example, in case where F2 excimer laser is used as the exposure light source, the glass substrate is required to have a flatness of 0.25 μm or less and a defect size of 0.07 μm or less. In case where EUV light is used as the exposure light source, the glass substrate is required to have a flatness of 0.05 μm or less and a defect size of 0.05 μm or less.

Upon production of a glass substrate for a mask blank, proposal has already been made of a precision polishing technique intended to reduce a surface roughness (for example, see Japanese Patent Application Publication (JP-A) No. 64-40267 (Reference 1)).

The precision polishing technique described in Reference 1 comprises the steps of polishing the substrate surface by the use of an abrasive primarily comprising cerium oxide and then finish-polishing the substrate surface by the use of colloidal silica. In case where the glass substrate is polished by the above-mentioned technique, use is typically made of a double-sided polishing apparatus of a batch type capable of receiving a plurality of glass substrates and simultaneously polishing opposite surfaces of the glass substrates.

In the precision polishing technique mentioned above, it is theoretically possible to achieve a desired flatness by reducing an average grain size of abrasive grains. Actually, however, under the influence of a mechanical accuracy of various components of the polishing apparatus, including a carrier for holding the glass substrate, a surface table for clamping the glass substrate, and a planetary gear mechanism for moving the carrier, and so on, the flatness of the glass substrate stably obtained is limited to about 0.5 μm.

In view of the above, proposal has recently been made of a leveling method for leveling or flattening the glass substrate by local machining using plasma etching or a gas cluster ion beam (for example, see Japanese Patent Application Publication (JP-A) No. 2002-316835 (Reference 2) and Japanese Patent Application Publication (JP-A) No. H08-293483 (Reference 3)).

The leveling method disclosed in References 2 and 3 comprises the steps of measuring a surface profile (convexity and concavity, peak and valley) of the glass substrate and executing local machining upon a convex portion under a machining condition (such as the amount of plasma etching or the amount of the gas cluster ion beam) depending upon the degree of convexity of the convex portion so as to flatten the surface of the glass substrate.

In case where the flatness of the surface of the glass substrate is adjusted by the local machining using the plasma etching or the gas cluster ion beam, a roughened surface or a machining-affected layer (a damaged layer) is formed on the glass substrate after the local machining. Therefore, it is necessary to perform polishing for a short time after the local machining in order to repair the roughened surface or to remove the machining-affected layer.

However, if polishing is performed in the state where machining scraps of the glass substrate or a reaction product produced by local machining are left on the surface of the glass substrate, microscopic defects having a depth on the order of several nanometers to several tens nanometers are caused on the surface of the glass substrate. As a result, it is impossible to obtain the glass substrate having a surface roughness Ra of 0.2 nm or less. The surface roughness Ra is representative of a center-line-mean roughness which is defined in Japanese Industrial Standard JIS B0601 and is also disclosed in U.S. Pat. No. 6,544,893 B2.

SUMMARY OF THE INVENTION

It is therefore an object of this invention to provide a method of producing a glass substrate for a mask blank, which includes a polishing step of polishing a surface of the glass substrate subjected to local machining in order to repair a roughened surface resulting from the local machining and to remove a machining-affected layer resulting from the local machining, and which is capable of preventing occurrence of a surface defect in the polishing step and reducing a surface roughness while maintaining a flatness of the surface of the glass substrate by removing, prior to the polishing step, machining scraps of the glass substrate and a reaction product.

It is another object of this invention to provide a method of producing a mask blank by the use of the above-mentioned glass substrate.

According to this invention, there is provided a method of producing a glass substrate for a mask blank, the method comprising:

a profile measuring step of measuring a convex/concave profile of a surface of the glass substrate for a mask blank;

a flatness control step of controlling a flatness of the surface of the glass substrate to a value not greater than a predetermined reference value by specifying the degree of convexity of a convex portion present on the surface of the glass substrate with reference to a result of measurement obtained in the profile measuring step and executing local machining upon the convex portion under a machining condition depending upon the degree of convexity; and a polishing step of polishing, after the flatness control step, the surface of the glass substrate subjected to the local machining; wherein:

the surface of the glass substrate subjected to the local machining is subjected to acid treatment after the flatness control step and before the polishing step.

According to this invention, there is also provided a method of producing a glass substrate for a mask blank, the method comprising:

a profile measuring step of measuring a convex/concave profile of a surface of the glass substrate for a mask blank;

a flatness control step of controlling a flatness of the surface of the glass substrate to a value not greater than a predetermined reference value by specifying the degree of convexity of a convex portion present on the surface of the glass substrate with reference to a result of measurement obtained in the profile measuring step and executing local machining upon the convex portion under a machining condition depending upon the degree of convexity; and a polishing step of polishing, after the flatness control step, the surface of the glass substrate subjected to the local machining; wherein:

the surface of the glass substrate subjected to the local machining is subjected to alkali treatment after the flatness control step and before the polishing step.

In each of the above-mentioned methods of producing a glass substrate for a mask blank, the surface of the glass substrate is subjected to the acid treatment or the alkali treatment after the flatness of the surface of the glass substrate is controlled by the local machining and before the polishing step intended to repair a roughened surface resulting from the local machining and to remove a machining-affected layer resulting from the local machining. Thus, machining scraps of the glass substrate, a reaction product, and the machining-affected layer produced by the local machining and left on the surface of the glass substrate are removed while maintaining the flatness of the surface of the glass substrate. As a consequence, it is possible to prevent occurrence of a surface defect during the polishing step and to reduce a surface roughness.

In the method of producing a glass substrate for a mask blank according to this invention, the local machining is carried out by plasma etching or a gas cluster ion beam.

In the above-mentioned method, by controlling the moving rate of the ion beam or the moving rate of a plasma source chamber or housing depending upon the degree of convexity of a convex portion on the surface of the glass substrate, it is possible to properly perform the local machining upon the convex portion on the surface of the glass substrate and to control the flatness to a value not greater than a predetermined reference value.

Alternatively, an ion beam intensity or a plasma intensity may be controlled depending upon the degree of convexity of a convex portion on the surface of the glass substrate.

In the method of producing a glass substrate for a mask blank according to this invention, an acid used in the acid treatment is fluorosilicic acid and/or hydrofluoric acid.

In the above-mentioned method, the machining-affected layer or the reaction product resulting from the local machining can effectively be removed. In this case, fluorosilicic acid or hydrofluoric acid may be used alone or a mixture of fluorosilicic acid and hydrofluoric acid may be used.

In the method of producing a glass substrate for a mask blank according to this invention, an acid used in the acid treatment is sulfuric acid.

In the above-mentioned method, machining scraps and organic substances left on the surface of the glass substrate can effectively be removed while maintaining a surface condition of the glass substrate.

In the method of producing a glass substrate for a mask blank according to this invention, the surface of the glass substrate subjected to the acid treatment is subjected to alkali treatment after the acid treatment.

In the above-mentioned method, a potential defect, such as a flaw, on the surface of the glass substrate is exposed by the alkali treatment. Thus, it is possible to easily detect the defect in defect inspection following the polishing step if the defect is present on the surface of the glass substrate.

In the method of producing a glass substrate for a mask blank according to this invention, the reference value is not greater than 0.25 μm.

In the above-mentioned method, by performing the local machining with the reference value of the flatness being 0.25 μm, the glass substrate for a F2 excimer laser exposure mask blank required to have a flatness of 0.25 μm or less can be obtained.

By performing the local machining with the reference value of the flatness being 0.05 μm, the glass substrate for an EUV mask blank required to have a flatness of 0.05 μm or less can be obtained.

A method of producing a mask blank according to this invention comprises the steps of preparing a glass substrate obtained by the method of producing a glass substrate for a mask blank and forming a thin film as a transferred pattern on the glass substrate.

In the above-mentioned method, the F2 excimer laser exposure mask blank or the EUV mask blank having a desired flatness, free from a surface defect, and having a high quality is obtained.

A method of producing a transfer mask according to this invention comprises the steps of preparing the mask blank obtained by the above-mentioned method and patterning the thin film of the mask blank to form a thin film pattern on the glass substrate.

A method of producing a semiconductor device according to this invention comprises the steps of preparing the transfer mask obtained by the above-mentioned method and transferring the thin film pattern of the transfer mask onto a semiconductor substrate by lithography.

DESCRIPTION OF THE PREFERRED EMBODIMENT

Figure 1:
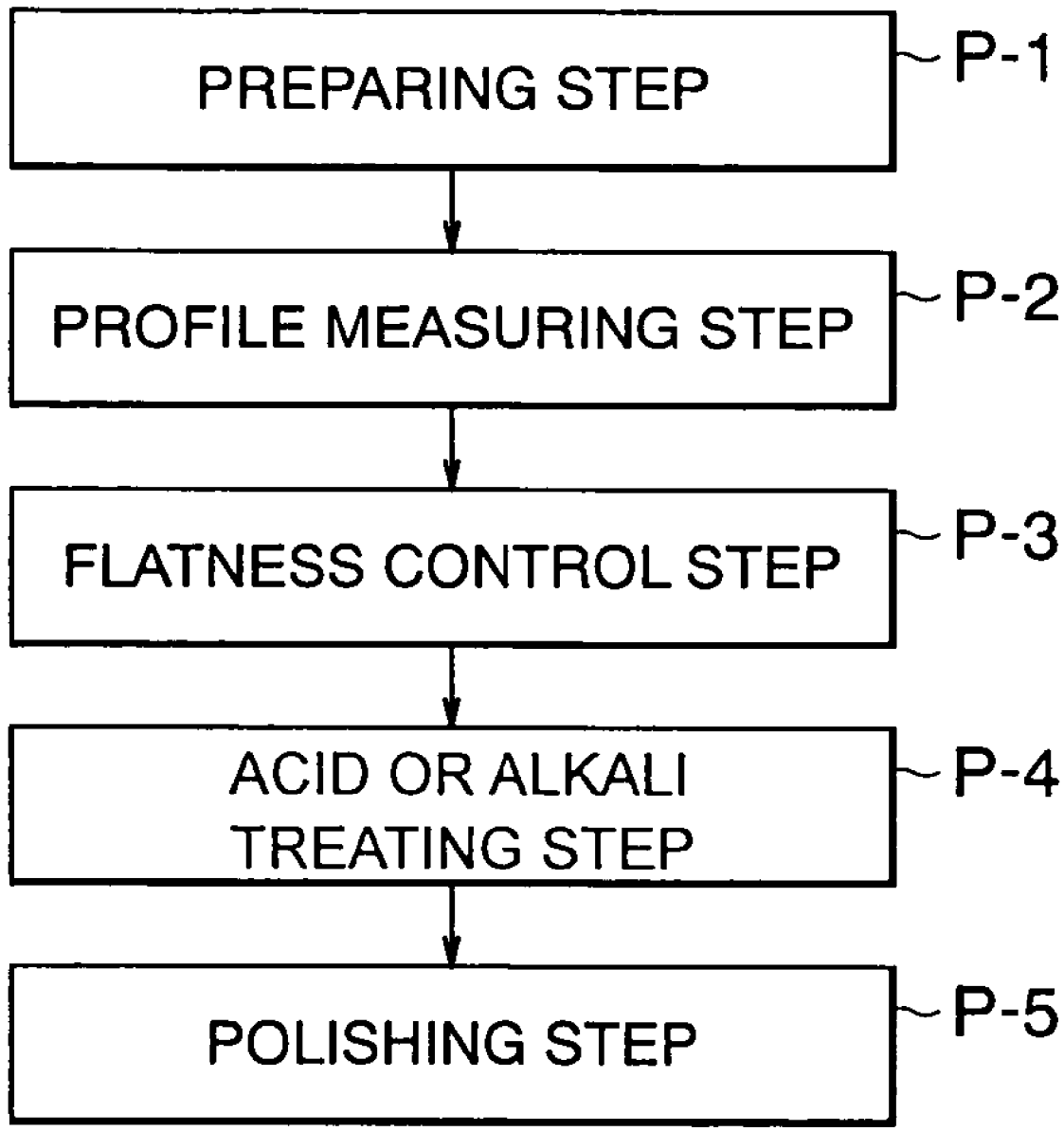
FIG. 1 is a flow chart for describing a production process of a glass substrate for a mask blank according to this invention.

Now, an embodiment of this invention will be described with reference to the drawing.

[Method of Producing a Glass Substrate for a Mask Blank]

At first referring to FIGS. 1 and 2, description will be made of a method of producing a glass substrate for a mask blank according to this invention.

Referring to FIG. 1, a production process of the glass substrate for a mask blank in this invention includes a preparing step (P-1) of preparing a glass substrate having a surface subjected to precision polishing, a profile measuring step (P-2) of measuring a convex/concave profile of the surface of the glass substrate, a flatness control step (P-3) of controlling a flatness of the surface of the glass substrate by local machining, an acid or an alkali treating step (P-4) of performing acid or alkali treatment upon the surface of the glass substrate, and a polishing step (P-5) of polishing the surface of the glass substrate.

<Preparing Step (P-1)>

In the preparing step (P-1), preparation is made of a glass substrate with its one surface or opposite surfaces precision-polished by the use of a polishing apparatus which will later be described.

The glass substrate is not particularly restricted but may be any substrate which is suitably used as a mask blank. For example, use may be made of a quartz glass, a soda lime glass, an aluminosilicate glass, a borosilicate glass, and an alkali-free glass.

In case of a glass substrate for a F2 excimer laser exposure mask blank, use may be made of a quartz glass doped with fluorine so as to suppress absorption of exposure light as small as possible.

In case of a glass substrate for an EUV mask blank, use may be made of a glass material having a low thermal expansion coefficient within a range of $0\pm1.0\times10^{-7}/°$ C., preferably within a range of $0\pm0.3\times10^{-7}/°$ C. in order to suppress distortion of a transferred pattern due to heat during exposure.

In the EUV mask blank, a number of films are formed on the glass substrate. Therefore, use is made of a glass material having a high rigidity and capable of suppressing deformation due to film stress. In particular, a glass material having a high Young's modulus of 65 GPa or more is preferable. For example, use may be made of an amorphous glass, such as a $SiO_2$—$TiO_2$ glass and a quartz glass, and a crystallized glass with β-quartz solid solution deposited therein.

Figure 2:
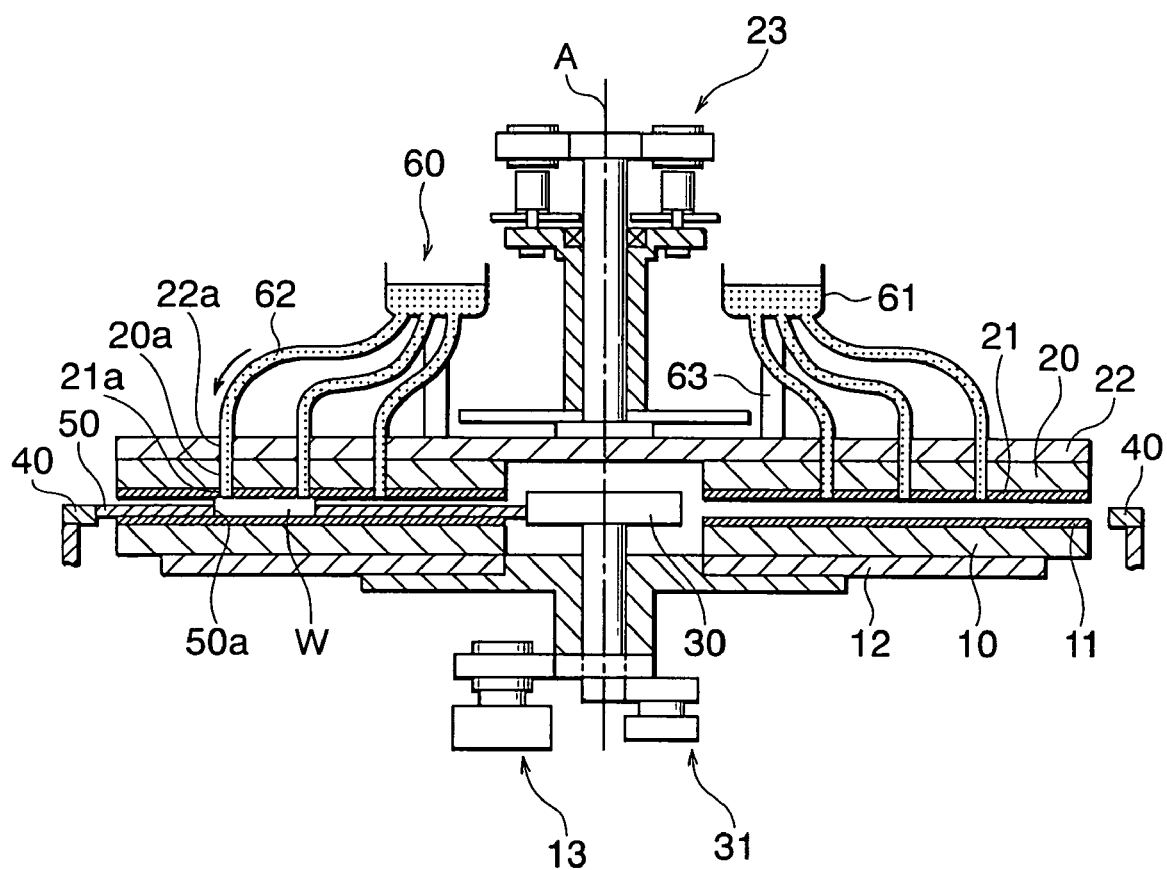
FIG. 2 is a schematic sectional view of a polishing apparatus used in the production process according to this invention.

Referring to FIG. 2, a polishing apparatus has a polishing portion of a planetary gear system comprising a lower surface table 10, an upper surface table 20, a sun gear 30, an internal gear 40, a carrier 50, and an abrasive supply member 60. The polishing portion polishes the opposite surfaces of the glass substrate by holding the glass substrate in the carrier 50, clamping the glass substrate between the upper and the lower surface tables 10 and 20 with polishing pads 11 and 21 attached thereto, respectively, supplying an abrasive in an area between the upper and the lower surface tables 10 and 20, and rotating and revolving the carrier 50. Hereinafter, the structure of the polishing portion will be described in detail.

The lower surface table 10 is a disk member having a ring-shaped horizontal upper surface with the polishing pad 11 attached thereto. The lower surface table 10 has a lower surface fixed to a lower support member 12 rotatable around a vertical shaft A (vertical shaft passing through the center of the polishing portion). The lower support member 12 is associated with a lower surface table rotation driving portion 13. Driven by the lower surface table rotation driving portion 13, the lower surface table 10 and the lower support member 12 are rotated.

The lower surface table 10 may be fixed to be unrotatable.

The upper surface table 20 is a disk member having a ring-shaped horizontal lower surface faced to the lower surface table 10 and provided with the polishing pad 21 attached thereto. The upper surface table 20 has an upper surface fixed to an upper support member 22 rotatable around the vertical shaft A. The upper support member 22 is associated with an upper surface table rotation driving portion 23. Driven by the upper surface table rotation driving portion 23, the upper surface table 20 and the upper support member 22 are rotated.

The upper surface table 20 and the upper support member 22 are supported to be movable upward and downward along the vertical shaft A. Driven by an upper surface table up/down driving portion (not shown), the upper surface table 20 and the upper support member 22 are moved upward and downward.

The upper surface table 20 may be fixed to be unrotatable.

The sun gear 30 is disposed at the center of the polishing portion to be rotatable. Driven by a sun gear rotation driving portion 31, the sun gear 30 is rotated around the vertical shaft A. However, if the internal gear 40 is rotated, the sun gear 30 may be fixed to be unrotatable.

The internal gear 40 is a ring-shaped gear having a series of teeth on an inner peripheral side and is disposed outside the sun gear 30 to be concentric therewith. The internal gear 40 in this embodiment is fixed to be unrotatable. Alternatively, the internal gear 40 may be rotatable around the vertical shaft A so that the internal gear 40 is rotated when it is driven by an internal gear rotation driving portion (not shown).

The carrier (planetary gear) 50 is a thin-plate disk member having a series of teeth on an outer peripheral side and is provided with one or a plurality of work holding apertures for holding the glass substrate.

The carrier 50 may be of a double-carrier type in which a holding member of an object W to be polished is loosely inserted in an aperture formed in the carrier.

The polishing portion generally has a plurality of carriers 50. These carriers 50 are engaged with the sun gear 30 and the internal gear 40 and are rotated and revolved around the sun gear 30 in accordance with the rotation of the sun gear 30 and/or the internal gear 40.

Each of the upper and the lower surface tables 20 and 10 has an outer diameter smaller than an inner diameter of the internal gear 40. An actual polishing region is a doughnut-like region between the sun gear 30 and the internal gear 40 and between the upper and the lower surface tables 20 and 10.

The abrasive supply member 60 comprises an abrasive storage 61 for storing the abrasive and a plurality of tubes 62 for supplying the abrasive stored in the abrasive storage 61 to the polishing region between the upper and the lower surface tables 20 and 10.

The abrasive storage 61 defines an annular abrasive storage channel on a horizontal plane and is disposed above the upper supporting member 22 through a plurality of support posts 63.

The upper support member 22, the upper surface table 20, and the polishing pad 21 are provided with a plurality of through holes 22a, 20a, and 21a communicating with one another, respectively, and connected to lower ends of the tubes 62. The abrasive stored in the abrasive storage 61 is supplied through the tubes 62 and the through holes 22a, 20a, and 21a to the polishing region between the upper and the lower surface tables 20 and 10.

The abrasive comprises fine abrasive grains dispersed in a liquid. For example, the abrasive grains may be silicon carbide, aluminum oxide, cerium oxide, zirconium oxide, manganese dioxide, and colloidal silica. Depending upon the material and the surface roughness of the glass substrate, the abrasive grains are appropriately selected. The abrasive grains are dispersed in a liquid, such as water, an acidic solution, or an alkaline solution, to be used as the abrasive.

The preparing step (P-1) at least comprises a lapping step of lapping the opposite surfaces of the glass substrate and a precision-polishing step of precision-polishing the opposite surfaces of the glass substrate after subjected to lapping. Thus, stepwise polishing is carried out.

For example, the lapping step is carried out by the use of an abrasive obtained by dispersing cerium oxide as relatively large abrasive grains while the precision-polishing step is carried out by the use of an abrasive obtained by dispersing colloidal silica as relatively small abrasive grains.

<Profile Measuring Step (P2)>

The profile measuring step (P-2) is a step of measuring the convex/concave profile (flatness) of the surface of the glass substrate prepared in the previous step (P-1).

Preferably, the convex/concave profile is measured by a flatness measurement apparatus or profilometer utilizing optical interference in view of a measuring accuracy. The flatness measurement apparatus carries out measurement by irradiating the surface of the glass substrate with coherent light, which is then reflected as reflected light, and detecting a phase difference of the reflected light corresponding to a height difference on the surface of the glass substrate.

For example, the flatness is defined as a difference between the maximum value and the minimum value of a measured plane of the surface of the glass substrate with respect to a virtual absolute plane (focal plane) calculated from the measured plane by a least square method.

The result of measurement of the convex/concave profile is stored in a recording medium such as a computer. Thereafter, the result of measurement is compared with a predetermined reference value (desired flatness) preliminarily be selected. The difference between the result of measurement and the reference value is calculated, for example, by an arithmetic unit of the computer. The difference is calculated for each predetermined region on the surface of the glass substrate. The predetermined region is determined to be coincident with a machining region in the local machining. Thus, the difference in each predetermined region corresponds to a required removed amount to be removed in the local machining for each machining region.

The above-mentioned calculation may be carried out in either the profile measuring step (P-2) or the flatness control step (P-3).

<Flatness Control Step (P-3)>

The flatness control step (P-3) is a step of specifying the degree of convexity of a convex portion present on the surface of the glass substrate with reference to the result of measurement obtained in the profile measuring step (P-2) and carrying out local machining upon the convex portion under the machining condition corresponding to the degree of convexity to control the flatness of the surface of the glass substrate to a value not greater than the predetermined reference value.

The local machining is carried out under the machining condition selected for each predetermined region on the surface of the glass substrate. The machining condition is determined with reference to the convex/concave profile of the surface of the glass substrate measured by the flatness measurement apparatus and the difference from the predetermined reference value of the flatness (required removed amount in the local machining).

Depending upon a machining apparatus, parameters of the machining condition are different. At any rate, the parameters are determined so that a greater amount is removed as the degree of convexity of the convex portion is greater. For example, in case where the local machining is carried out by the use of an ion beam or plasma etching, the moving rate of the ion beam or the moving rate of a plasma source chamber is controlled to be slower as the degree of convexity is greater. Alternatively, the ion beam intensity or the plasma intensity may be controlled.

As a local machining method used in the flatness control step (P-3), not only the ion beam machining and the plasma etching mentioned above but also various other methods, such as MRF (MagnetoRheological Finishing) and CMP (Chemical-Mechanical Polishing) may be used.

In the MRF, an object to be machined (glass substrate) is locally polished by bringing abrasive grains contained in a magnetic fluid into contact with the object at a high speed and controlling a holding time of a contacted portion between the abrasive grains and the object.

The CMP comprises the steps of polishing a convex portion of the surface of the object by the use of a small-diameter polishing pad and an abrasive (containing abrasive grains such as colloidal silica) and by controlling the holding time of a contacted portion between the small-diameter polishing pad and the object (glass substrate).

Among the local machining methods mentioned above, local machining by the ion beam, plasma etching, or the CMP leaves a roughened surface or a machining-affected layer on the surface of the glass substrate. Therefore, acid treatment (which will later be described) is particularly effective.

Hereinafter, description will be made of the local machining by plasma etching and the ion beam particularly suitable in the flatness control step (P-3).

The local machining method by the plasma etching comprises the steps of positioning the plasma source chamber above a surface portion to be removed and flowing an etching gas to thereby etch the portion to be removed. By flowing the etching gas, neutral radical species generated in plasma isotropically collide with the surface of the glass substrate so that the above-mentioned portion is removed. On the other hand, a remaining portion where the plasma source chamber is not located is not etched by collision of the etching gas because no plasma is produced.

When the plasma source chamber is moved on the glass substrate, the removed amount is adjusted by controlling the moving rate of the plasma source chamber or the plasma intensity in accordance with the required removed amount of the surface of the glass substrate.

The plasma source chamber may have a structure in which the glass substrate is clamped by a pair of electrodes. Plasma is generated between the substrate and the electrodes by a high-frequency wave and the etching gas is supplied to thereby generate radical species. Alternatively, the plasma source chamber may comprise a waveguide tube through which the etching gas flows. Plasma is generated by oscillation of microwave to produce a stream of radical species, which impinges on the surface of the glass substrate.

The etching gas is appropriately selected depending upon the material of the glass substrate. For example, use is made of a gas of halogen compound or a mixed gas containing halogen compound. More specifically, use may be made of tetrafluoromethane, trifluoromethane, hexafluoroethane, octafluoropropane, decafluorobutane, hydrogen fluoride, sulfur hexafluoride, nitrogen trifluoride, carbon tetrachloride, silicon tetrafluoride, trifluorochloromethane, and boron trichloride.

The local machining method by the ion beam (irradiation by the gas cluster ion beam) comprises the steps of preparing a substance, such as oxide, nitride, carbide, a rare gas, having a gaseous phase at normal temperature and normal pressure (room temperature and atmospheric pressure) or a mixed gas thereof (a substance as a mixed gas obtained by mixing the above-mentioned substances at an appropriate ratio), forming a gas cluster of the substance, ionizing the gas cluster by electron irradiation to form the gas cluster ion beam, and irradiating a solid surface (surface of the glass substrate) with the gas cluster ion beam in an irradiated region which may be controlled if necessary.

Generally, the cluster comprises a group of several hundreds of atoms or molecules. Even if an accelerated voltage is 10 kV, irradiation occurs as an ultraslow ion beam having energy not greater than several tens eV per atom or molecule. Therefore, the surface of the glass substrate is machined with extremely low damage.

When the surface of the glass substrate is irradiated by the gas cluster ion beam, the molecules or the atoms forming cluster ions collide with atoms of the surface of the glass substrate in multiple stages to produce reflected molecules or atoms having a lateral or horizontal kinetic component. As a result, selective sputtering occurs at the convex portion on the surface of the glass substrate so as to flatten the surface of the glass substrate. Such flattening phenomenon is also obtained by the effect of preferentially sputtering those atoms present on the surface or grains and having a weak bond, by the energy concentrated to the surface of the glass substrate.

The generation of the gas cluster itself is already known. That is, the gas cluster can be produced by blowing a gaseous substance in a compressed state into a vacuum apparatus through an expansion nozzle. The gas cluster thus produced can be ionized by irradiation with electrons.

Herein, the gaseous substance may be oxide, such as $CO_2$, CO, $N_2O$, NOx, and CxHyOz, $O_2$, $N_2$, and a rare gas such as Ar and He.

The flatness required to the glass substrate for a mask blank is determined in correspondence to the wavelength of an exposure light source used for the mask blank. Depending upon the required flatness, the reference value for controlling the flatness in the flatness control step (P-3) is determined.

For example, in case of the glass substrate for a F2 excimer laser exposure mask blank, the reference value for controlling the flatness is not greater than 0.25 μm. In case where the glass substrate for an EUV mask blank, the reference value for controlling the flatness is not greater than 0.5 μm. By the use of the reference value, the local machining is carried out.

<Acid or Alkali Treating Step (P-4)>

The acid or the alkali treating step (P-4) is a step in which acid or alkali treatment is carried out upon the surface of the glass substrate subjected to the local machining in the flatness control step (P-3).

An acid or an alkali used in the acid or the alkali treatment is selected so that machining scraps of the glass substrate, a reaction product, and a machining-affected layer left on the surface of the glass substrate are removed while maintaining the flatness of the surface of the glass substrate and without deteriorating the surface roughness. For example, as the acid, use may be made of hydrochloric acid, nitric acid, perchloric acid, sulfuric acid, hydrofluoric acid, fluorosilicic acid, phosphoric acid, or a mixture thereof. As the alkali, sodium hydroxide or potassium hydroxide may be used.

The type of the acid or the alkali, the concentration of the acid or the alkali, the acid or the alkali treatment temperature, and the acid or the alkali treatment time are determined so that the machining scraps, the reaction product, and the machining-affected layer are reliably removed and that deterioration in flatness and surface roughness of the surface of the glass substrate is suppressed.

A method for the acid treatment is not specifically limited. For example, dipping or spraying may be used. In view of the efficiency of removal, the acid treatment is preferably carried out by dipping under application of ultrasonic wave.

In case where fluorosilicic acid and/or hydrofluoric acid is used as the acid for the acid treatment, the machining-affected layer and the reaction product left on the surface of the glass substrate is effectively removed. Fluorosilicic acid or hydrofluoric acid may be used alone or, alternatively, a mixed acid of fluorosilicic acid and hydrofluoric acid may be used.

The condition of the acid treatment is determined so that the machining-affected layer and the reaction product are selectively removed and the damage upon the glass substrate is minimized (the surface roughness is not increased). Although depending upon the type of the glass substrate, the acid concentration of an acidic solution used in the acid treatment is preferably 0.05-10 vol % for fluorosilicic acid and 0.05-10 vol % for hydrofluoric acid. The treatment temperature is preferably 20-80° C.

If sulfuric acid is used in the acid treatment, glass scraps and organic substances left on the surface of the glass substrate are effectively removed while maintaining the surface condition (surface roughness and flatness) of the glass substrate.

In case of dense sulfuric acid (98% or more), the concentration of sulfuric acid in a sulfuric acid solution used in sulfuric acid treatment is preferably 0.1-10 vol % although depending upon the type of the glass substrate. The treatment temperature is preferably 20-80° C.

After the acid treatment mentioned above, the surface of the glass substrate subjected to the acid treatment may be subjected to alkali treatment. Alternatively, the acid treatment may be replaced by the alkali treatment. In this case, the alkali treatment exposes a potential defect, such as a flaw, on the surface of the glass substrate. Therefore, it is possible to easily detect the defect in defect inspection following the polishing step if the defect is present on the surface of the glass substrate.

The concentration of an alkali solution used in the alkali treatment is preferably 0.5-10 vol %. The treatment temperature is preferably 20-80° C.

A method for the alkali treatment is not specifically limited. For example, dipping or spraying may be used. In view of the efficiency of the treatment, the alkali treatment is preferably carried out by dipping under application of ultrasonic wave.

<Polishing Step (P-5)>

The polishing step (P-5) is a step of polishing the surface of the glass substrate for the purpose of repairing the roughened surface and removing the machining-affected layer produced on the surface of the glass substrate as a result of the local machining.

It is therefore preferable to adopt a polishing method capable of improving the surface roughness and maintaining the flatness achieved by the local machining. For example, use is preferably made of non-contact polishing in which polishing is carried out by the action of a machining liquid interposed between the surface of the glass substrate and the surface of a polishing tool without direct contact therebetween. For example, float polishing and EEM (Elastic Emission Machining) may be used as the non-contact polishing.

Instead of the non-contact polishing, it is possible to use a polishing method (for example, one-side polishing) in which the surface of the polishing tool, such as a polishing pad, is directly contacted with the surface of the glass substrate. In this case, however, direct contact between the surface of the polishing tool and the surface of the glass substrate may possibly result in deterioration of the flatness achieved by the local machining. Therefore, it is preferable to shorten the polishing time.

The abrasive used in the polishing step (P-5) is preferably small in average grain size in order to reduce the surface roughness. For example, the abrasive having an average grain size of 0.1 μm or less is used. Specifically, silica, colloidal silica, cerium oxide, and zirconium oxide may be used.

[Method of Producing a Mask Blank]

Next, description will be made of a method of producing a mask blank according to one embodiment of this invention.

The method of producing a mask blank comprises the steps of preparing a glass substrate obtained by the above-mentioned method of producing a glass substrate for a mask blank and forming a thin film as a transferred pattern on the glass substrate.

The mask blank is classified into a transmissive mask blank and a reflective mask blank. In either mask blank, the thin film as the transferred pattern is formed on the glass substrate. A resist film may be formed on the thin film.

The thin film formed on the transmissive mask blank causes optical change in exposure light (light emitted from the exposure light source) used in pattern transfer to a transfer object. For example, the thin film may be a light shielding film (an opaque film) for shielding the exposure light or a phase shift film for changing the phase of the exposure light.

Generally, the light shielding film may be a Cr film, a Cr alloy film selectively containing oxygen, nitrogen, carbon, or fluorine in addition to Cr, a laminated film thereof, a MoSi film, a MoSi alloy film selectively containing oxygen, nitrogen, or carbon in addition to MoSi, and a laminated film thereof.

The phase shift mask may be a $SiO_2$ film having a phase shift function alone, a metal silicide oxide film, a metal silicide nitride film, a metal silicide oxynitride film, a metal silicide oxycarbide film, a metal silicide oxycarbonitride film (metal: transition metal such as Mo, Ti, W, Ta) each of which has a phase shift function and a light shielding function, and a halftone film such as a CrO film, a CrF film, and a SiON film.

The reflective mask blank comprises a glass substrate and a laminated film formed thereon and including a reflective multilayer film (reflective multilayer film) and a light absorber film (absorber layer) as a transferred pattern.

The reflective multilayer film may comprise a Ru/Si periodic multilayer film, a Mo/Be periodic multilayer film, a Mo-compound/Si-compound periodic multilayer film, a Si/Nb periodic multilayer film, a Si/Mo/Ru periodic multilayer film, a Si/Mo/Ru/Mo periodic multilayer film, and a Si/Ru/Mo/Ru periodic multilayer film.

The light absorber film may be made of a material such as Ta, Ta alloy (for example, a material containing Ta and B, a material containing Ta, B, and N), Cr, Cr alloy (for example, a material containing Cr and at least one element selected from nitrogen, oxygen, carbon, and fluorine).

For the transmissive mask blank, g ray (having a wavelength of 436 nm), i ray (having a wavelength of 365 nm), KrF (having a wavelength of 246 nm), ArF (having a wavelength of 193 nm), or F2 (having a wavelength of 157 nm) may be used as the wavelength of the exposure light source. For the reflective mask blank, EUV (having a wavelength of 13 nm) may be used as the wavelength of the exposure light source.

For example, the above-mentioned thin film may be formed by sputtering such as DC sputtering, RF sputtering, ion beam sputtering.

EXAMPLES AND COMPARATIVE EXAMPLES

Hereinafter, description will be made of examples of this invention in conjunction with a method of producing a glass substrate for an EUV reflective mask blank (hereinafter simply be referred to as a glass substrate) and a method of producing an EUV reflective mask blank. It will readily be understood that this invention is not limited to the following examples.

Example 1

Local Plasma Etching+Sulfuric Acid Treatment

Preparation was made of a glass substrate (having a size of 152.4 mm×152.4 mm and a thickness of 6.35 mm) which has been polished stepwise by cerium oxide abrasive grains and colloidal silica abrasive grains by the use of the above-mentioned polishing apparatus.

The surface profile (flatness) of the glass substrate was measured by a flatness measurement apparatus utilizing optical interference. As a result, the glass substrate had a flatness of 0.2 μm (convex) and a surface roughness of 0.15 nm as a root-mean-square roughness Rq (=RMS). The root-mean-square roughness Rq is also disclosed in U.S. Pat. No. 6,544,893 B2.

The result of profile measurement of the surface of the glass substrate was stored in a computer and compared with a reference value of 0.05 μm (convex) as a required flatness for the glass substrate for an EUV mask blank. The difference (required removed amount) between the measured flatness and the reference value was calculated by the computer.

Next, for every predetermined region (5 mm square) within the plane of the glass substrate, the machining condition for local plasma etching was determined in correspondence to the required removed amount. According to the machining condition thus determined, the profile was adjusted by the local plasma etching so that the flatness of the glass substrate is not greater than the reference value (flatness of 0.05 μm).

The local plasma etching was carried out by the use of tetrafluoromethane as an etching gas and a plasma source chamber of a high-frequency type having a cylindrical electrode.

After the profile was adjusted by the local plasma etching, the flatness of the surface of the glass substrate was measured. As a result, the flatness was as excellent as 0.05 μm. The surface roughness Rq of the surface of the glass substrate was equal to about 1 nm. Thus, the surface was roughened as a result of the plasma etching.

Further, a machining-affected layer on the surface of the glass substrate after profile adjustment was examined by TEM (Transmission Electron Microscope) observation. As a result, it was found out that the machining-affected layer was formed by the plasma etching as a surface layer of the glass substrate.

The surface of the glass substrate was observed by SEM (Scanning Electron Microscopy) (surface analysis by total reflection X-ray fluorescence). As a result, it was confirmed that machining scraps presumably produced by the plasma etching and a residue of the gas used in the plasma etching were adhered.

In order to remove the machining scraps left on the surface of the glass substrate and the residue of the gas used in the plasma etching while maintaining the surface condition (surface roughness and flatness) of the glass substrate, sulfuric acid treatment was carried out under the following condition.

| | |
|---|---|
| Condition of sulfuric acid treatment: | dense sulfuric acid (98%) concentration of 0.5 vol % temperature of 40° C. treatment time of 5-20 min |
| Method of sulfuric acid treatment: | dipping the glass substrate in sulfuric acid solution and applying ultrasonic wave |

After the sulfuric acid treatment, the flatness and the surface roughness of the surface of the glass substrate were measured. As a result, the surface condition was not substantially changed as compared with that before the sulfuric acid treatment.

Next, in order to reduce the surface roughness of the glass substrate and to remove the machining-affected layer, non-contact polishing was carried out by float polishing. The polishing condition in the float polishing was as follows:

| | |
|---|---|
| Machining liquid (Polishing slurry): | pure water + fine powder particles (concentration of 2 wt %) |
| Fine powder particles: | silica ($SiO_2$) having average grain size of about 70 nm |
| Rotation speed of rotary table: | 5-200 rpm |
| Rotation speed of work holder: | 10-300 rpm |
| Polishing time: | 5-30 min |

Thereafter, the glass substrate was cleaned by ultra pure water to obtain the glass substrate for an EUV mask blank.

The flatness and the surface roughness of the glass substrate thus obtained were measured. As a result, the flatness was as excellent as 0.05 μm without change. The surface roughness Rq was 0.09 nm. Thus, the roughened surface of the glass substrate was repaired.

The surface defect of the surface of the glass substrate was inspected by a defect inspection apparatus described in Japanese Patent Application Publication (JP-A) No. H11-242001. The inspection apparatus carries out defect inspection by introducing a laser beam from a chamfered surface of the substrate, confining the laser beam by total reflection, and detecting light scattered by the defect and leaking out from the substrate. As a result of the defect inspection, no flaw having a size exceeding 0.05 μm was found.

By TEM observation, the machining-affected layer on the surface of the glass substrate was checked. As a result, it was confirmed that the machining-affected layer was removed.

Thus, the glass substrate thus obtained satisfied the requirement for a glass substrate for an EUV mask blank.

Example 2

Local Plasma Etching+Fluorosilicic Acid Treatment

A glass substrate was produced in the manner similar to Example 1 except that the sulfuric acid treatment was replaced by fluorosilicic acid treatment and that the non-contact polishing by float polishing was replaced by one-side polishing. The fluorosilicic acid treatment was carried out under the following condition.

| | |
|---|---|
| Condition of acid treatment: | fluorosilicic acid (40%) concentration of 0.3 vol % temperature of 50° C. treatment time of 1-5 min |
| Method of acid treatment: | dipping the glass substrate in fluorosilicic acid solution and applying ultrasonic wave. |

After the fluorosilicic acid treatment, the flatness and the surface roughness of the glass substrate were measured. As a result, the flatness was not changed but the surface roughness Rq was 0.17 nm. Thus, the surface was slightly roughened. As confirmed by TEM observation, no machining-affected layer was found.

Next, in order to reduce the surface roughness of the glass substrate, one-side polishing was carried out. The polishing condition in the one-side polishing was as follows:

| | |
|---|---|
| Machining liquid (Polishing slurry): | alkali aqueous solution (NaOH) + fine powder particles (concentration of 2 wt %), pH: 11 |
| Fine powder particles: | colloidal silica having an average grain size of 70 nm |
| Rotation speed of polishing surface Table: | 1-50 rpm |
| Rotation speed of polishing plate: | 1-50 rpm |
| Machining pressure: | 0.1-10 kPa |
| Polishing time: | 1-10 min |

Thereafter, the glass substrate was cleaned by ultra pure water to obtain the glass substrate for an EUV mask blank.

The flatness and the surface roughness of the glass substrate thus obtained were measured. As a result, the flatness was as excellent as 0.05 μm without change. The surface roughness Rq was 0.15 nm. Thus, the roughened surface of the glass substrate was repaired.

The surface defect of the surface of the glass substrate was inspected by the defect inspection apparatus described in Japanese Patent Application Publication (JP-A) No. H11-242001. As a result, no flaw having a size exceeding 0.05 μm was found.

Thus, the glass substrate obtained as mentioned above satisfied the requirement for a glass substrate for an EUV mask blank.

Example 3

Example 1+Alkali Treatment

Example 4

Example 2+Alkali Treatment

Glass substrates were produced in the manner similar to Examples 1 and 2 except that alkali treatment was carried out after the sulfuric acid treatment (before non-contact polishing) and that alkali treatment was carried out after fluorosilicic acid treatment (before one-side polishing), respectively. The alkali treatment was carried out under the following condition.

| | |
|---|---|
| Condition of alkali treatment: | alkali aqueous solution (NaOH) concentration of 2 vol % temperature of 50° C. Treatment time: 10-30 min |
| Method of alkali treatment: | dipping the glass substrate in alkali aqueous solution and applying ultrasonic wave |

The flatness and the surface roughness of the glass substrate thus obtained were measured. As a result, the flatness was as excellent as 0.05 μm without change. The surface roughness Rq was 0.15 nm. Thus, the roughened surface of the glass substrate was repaired.

By the alkali treatment, a potential defect existing in the surface layer or the inside of the glass substrate would be enlarged. However, as a result of inspection of the surface defect of the glass substrate by the defect inspection apparatus described in Japanese Patent Application Publication (JP-A) No. H11-242001, no flaw having a size exceeding 0.05 µm was found.

Thus, the glass substrate obtained as mentioned above satisfied the requirement for a glass substrate for an EUV mask blank.

Example 5

Local Plasma Etching+Alkali Treatment

A glass substrate was produced in the manner similar to Example 1 except that the acid treatment was replaced by alkali treatment. The alkali treatment was carried out in the following condition.

| Condition of alkali treatment: | alkali aqueous solution (NaOH) concentration of 5 vol % temperature of 50° C. treatment time: 10-30 min |
|---|---|
| Method of alkali treatment: | dipping the glass substrate in alkali aqueous solution and applying ultrasonic wave |

The flatness and the surface roughness of the glass substrate thus obtained were measured. As a result, the flatness was as excellent as 0.05 µm without change. The surface roughness Rq was 0.15 nm. Thus, the roughened surface of the glass substrate was repaired.

By the alkali treatment, a potential defect existing in the surface layer or the inside of the glass substrate would be enlarged. However, as a result of inspection of the surface defect of the glass substrate by the defect inspection apparatus described in Japanese Patent Application Publication (JP-A) No. H11-242001, no flaw having a size exceeding 0.05 µm was found.

Thus, the glass substrate obtained as mentioned above satisfied the requirement for a glass substrate for an EUV mask blank.

Comparative Example

No Acid Treatment

A glass substrate was prepared in the manner similar to Example 2 except that the fluorosilicic acid treatment was not carried out.

However, in order to remove the machining-affected layer and to reduce the surface roughness, one-side polishing was carried out in the following condition.

| Machining liquid (Polishing slurry): | alkali aqueous solution (NaOH) + fine powder particles (concentration of 2 wt %), pH: 11 |
|---|---|
| Fine powder particles: | colloidal silica having an average grain size of about 70 nm |
| Rotation speed of polishing surface table: | 1-50 rpm |
| Rotation speed of polishing plate: | 1-50 rpm |
| Machining pressure: | 0.2-20 kPa |
| Polishing time: | 2-20 min |

The flatness and the surface roughness of the glass substrate thus obtained were measured. As a result, the surface roughness Rq was degraded to 0.15 nm. The flatness was 0.25 µm which was degraded as compared with that before the one-side polishing and that before the flatness was adjusted by the local plasma etching.

The surface defect of the surface of the glass substrate was inspected by the above-mentioned defect inspection apparatus. As a result, a number of flaws exceeding 0.05 µm were found. This is presumably because foreign matters such as machining scraps produced by the local plasma etching damaged the surface of the glass substrate during the one-side polishing.

Thus, the glass substrate obtained in Comparative Example did not satisfy the requirement for a glass substrate for an EUV mask blank.

<Production of EUV Reflective Mask Blank and EUV Reflective Mask>

Figure 3A:
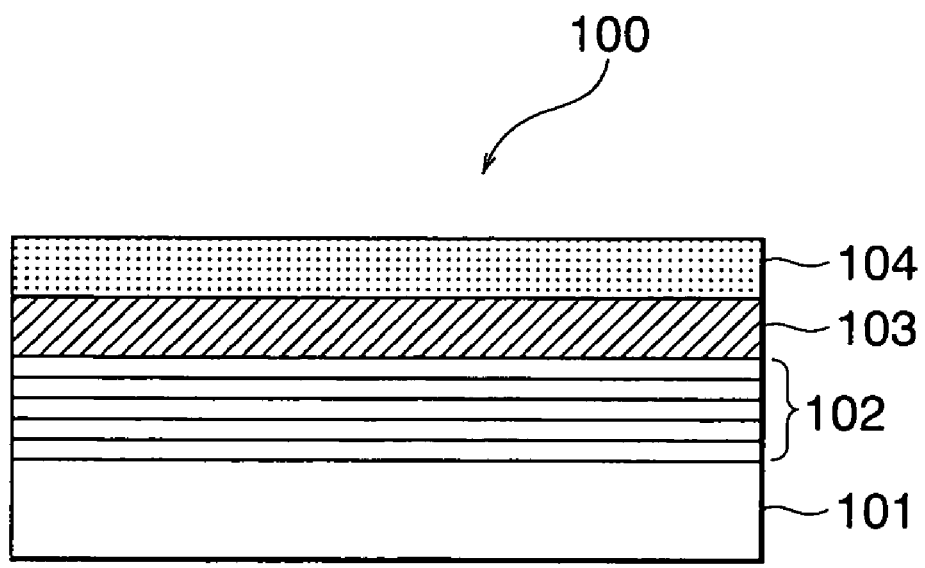
FIG. 3A is a sectional view of an EUV reflective mask blank which uses the glass substrate according to this invention.
Figure 3B:
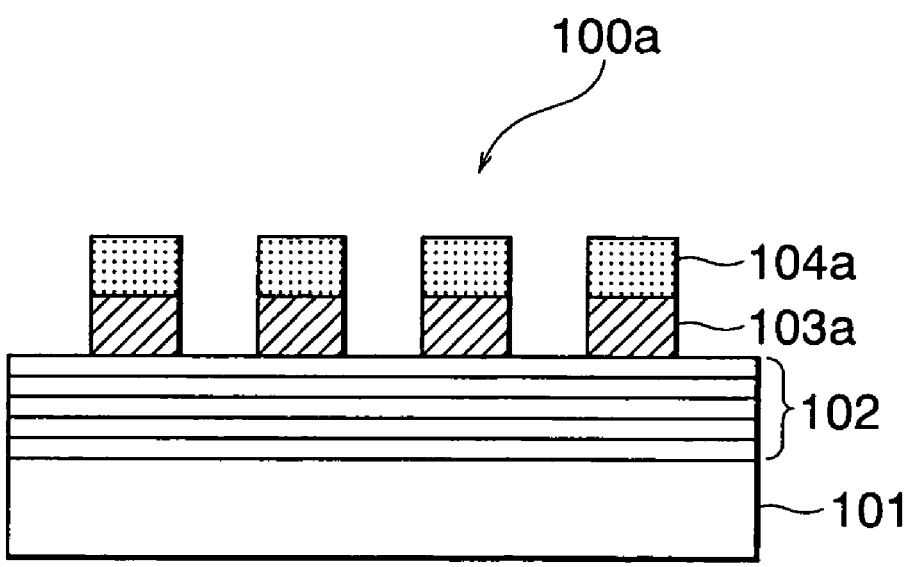
FIG. 3B is a sectional view of an EUV reflective mask which uses the glass substrate according to this invention.

Referring to FIGS. 3A and 3B, production of the EUV reflective mask blank and the EUV reflective mask will be described.

On a glass substrate 101 which is obtained either in each of Examples 1 to 5 or in Comparative Example, 40 periods of Si films and Mo films were laminated by DC magnetron sputtering. It is noted here that a single period of deposition includes a Si film having the thickness of 4.2 nm and a Mo film having the thickness of 2.8 nm. Then, another Si film having the thickness of 11 nm was formed. Thus, a reflective multilayer film 102 was produced. Next, by DC magnetron sputtering, a chromium nitride (CrN) film having the thickness of 30 nm as a buffer layer 103 and a TaBN film having a thickness of 60 nm as an absorber layer 104 were formed on the reflective multilayer film 102. Thus, the EUV reflective mask blank 100 was obtained.

The EUV reflective mask blank 100 thus obtained was subjected to surface defect inspection (by the use of the inspection apparatus for detecting the surface defect by emitting light and detecting the signal intensities of transmitted light and reflective light) for surface defects such as particles and pin holes. As a result, the EUV reflective mask blank 100 produced by the use of the glass substrate 101 obtained in each of Examples 1 to 5 had no surface defect. On the other hand, it was confirmed that the EUV reflective mask blank 100 produced by the use of the glass substrate 101 obtained in Comparative Example had a surface defect which was supposed to be a film defect resulting from the glass substrate 101.

Next, by the use of the EUV reflective mask blank 100, an EUV reflective mask 100a with a 16 Gbit-DRAM pattern having a design rule of 0.07 µm was produced.

At first, an EB resist was applied to the EUV reflective mask blank 100. By EB writing and development, a resist pattern was formed.

Next, using the resist pattern as a mask, the absorber layer 104 was dry-etched using chlorine to form an absorber pattern 104a on the EUV reflective mask blank 100.

The resist pattern left on the absorber pattern 104a was removed by hot sulfuric acid. Thereafter, the buffer layer 103 was dry-etched following the absorber pattern 104a by the use of a mixed gas of chlorine and oxygen to form a patterned buffer layer 103a. Thus, the EUV reflective mask 100a was obtained.

Figure 4:
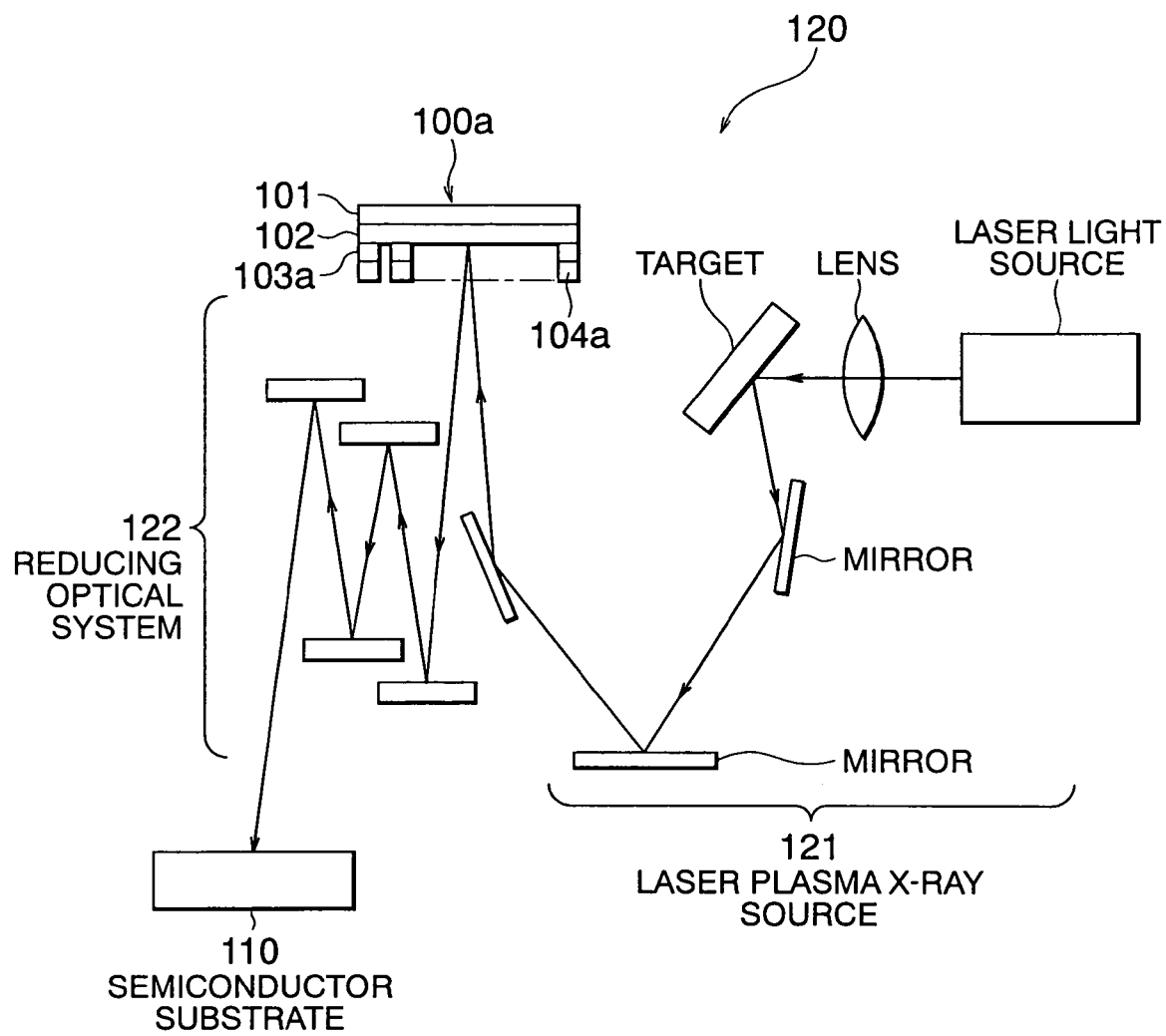
FIG. 4 is a view for describing pattern transfer using the reflective mask.

Next referring to FIG. 4, description will be made of a method of transferring a pattern by EUV light onto a semiconductor substrate with a resist by the use of the EUV reflective mask 100a.

A pattern transfer apparatus 120 illustrated in the figure comprises a laser plasma X-ray source 121, the EUV reflective mask 100a, and a reducing optical system 122. The reducing optical system 122 comprises an X-ray reflection mirror. The pattern reflected by the EUV reflective mask 100a is reduced to about ¼. Since the wavelength band of 13-14 nm is used as the exposure wavelength, an optical path is preliminarily positioned in vacuum.

In the above-mentioned state, EUV light emitted from the laser plasma X-ray source 121 is incident to the EUV reflective mask 100a. The light reflected by the EUV reflective mask 100a is transferred to the semiconductor substrate 110 with a resist through the reducing optical system 122.

Specifically, the light incident to the EUV reflective mask 100a is absorbed by the absorber layer 104 and is not reflected in an area where the absorber pattern 104a is present. On the other hand, the light incident to a remaining area where the absorber pattern 104a is not present is reflected by the reflective multilayer film 102. Thus, a pattern formed by the reflected light from the EUV reflective mask 100a is transferred through the reducing optical system 122 to a resist layer on the semiconductor substrate 110.

By the use of the EUV reflective mask 100a comprising the glass substrate 101 obtained in each of Examples 1-5 and Comparative Example, pattern transfer onto the semiconductor substrate was carried out by the pattern transfer method mentioned above. As a result, it was confirmed that the EUV reflective mask 100a in each of Examples 1-5 had an accuracy of 16 nm or less, as required in the 0.07 μm design rule. On the other hand, the EUV reflective mask 100a in Comparative Example did not satisfy the accuracy of 16 nm or less as required in the 0.07 μm design rule.

As described above, according to this invention, the machining scraps of the glass substrate and the reaction product are removed prior to the polishing step of polishing the surface of the glass substrate subjected to the local machining in order to repair the roughened surface resulting from the local machining and to remove the machining-affected layer resulting from the local machining. It is therefore possible to prevent occurrence of the surface defect in the polishing step and to reduce the surface roughness while maintaining the flatness of the surface of the glass substrate Although the present invention has been shown and described in conjunction with a few preferred embodiments or examples thereof, it will readily be understood by those skilled in the art that the present invention is not limited to the foregoing description but may be changed and modified in various other manners without departing from the spirit and scope of the present invention as set forth in the appended claims.

What is claimed is:

1. A method of producing a glass substrate for an EUV (extreme ultra violet) mask blank, the method comprising:
   a preparing step of preparing the glass substrate having a surface subjected to precision polishing;
   a profile measuring step of measuring, after the preparing step, a convex/concave profile of the surface of the glass substrate;
   a flatness control step of controlling a flatness of the surface of the glass substrate to a value not greater than a reference value determined depending upon a required flatness required to the glass substrate by specifying the degree of convexity of a convex portion present on the surface of the glass substrate with reference to a result of measurement obtained in the profile measuring step and executing local machining upon the convex portion under a machining condition depending upon the degree of convexity, the local machining being carried out by plasma etching or a gas cluster ion beam;
   an acid treatment step of subjecting, after the flatness control step, the surface of the glass substrate to acid treatment under a condition that machining scraps of the glass substrate, a reaction product, and a machining-affected layer produced by the local machining and left on the surface of the glass substrate are removed while maintaining the flatness and a surface roughness of the glass substrate; and
   a polishing step of polishing, after the acid treatment step, the surface of the glass substrate;
   said method thereby making the surface of the glass substrate have a flatness and a surface roughness required of the glass substrate for producing the EUV mask blank.

2. A method of producing a glass substrate for an EUV (extreme ultra violet) mask blank, the method comprising:
   a preparing step of preparing the glass substrate having a surface subjected to precision polishing;
   a profile measuring step of measuring, after the preparing step, a convex/concave profile of the surface of the glass substrate;
   a flatness control step of controlling a flatness of the surface of the glass substrate to a value not greater than a reference value determined depending upon a required flatness required to the glass substrate by specifying the degree of convexity of a convex portion present on the surface of the glass substrate with reference to a result of measurement obtained in the profile measuring step and executing local machining upon the convex portion under a machining condition depending upon the degree of convexity, the local machining being carried out by plasma etching or a gas cluster ion beam;
   an alkali treatment step of subjecting, after the flatness control step, the surface of the glass substrate to alkali treatment under a condition that machining scraps of the glass substrate, a reaction product, and a machining-affected layer produced by the local machining and left on the surface of the glass substrate are removed while maintaining the flatness and a surface roughness of the glass substrate; and
   a polishing step of polishing, after the alkali treatment step, the surface of the glass substrate;
   said method thereby making the surface of the glass substrate have a flatness and a surface roughness required of the glass substrate for producing the EUV mask blank.

3. A method according to claim 1, wherein an acid used in the acid treatment is fluorosilic acid and/or hydrofluoric acid.

4. A method according to claim 1, wherein an acid used in the acid treatment is sulfuric acid.

5. A method according to claim 1, wherein the surface of the glass substrate subjected to the acid treatment is subjected to alkali treatment after the acid treatment.

6. A method according to claim 1, wherein the reference value is not greater than 0.05 μm.

7. A method of producing a mask blank, the method comprising the steps of preparing the glass substrate obtained by the method according to claim 1, and forming a thin film as a transferred pattern on the glass substrate.

8. A method of producing a transfer mask, the method comprising the steps of preparing the mask blank obtained by the method according to claim 7 and patterning the thin film of the mask blank to form a thin film pattern on the glass substrate.

9. A method of producing a semiconductor device, the method comprising the steps of preparing the transfer mask obtained by the method according to claim 8 and transferring the thin film pattern of the transfer mask onto a semiconductor substrate by lithography.

10. A method according to claim 2, wherein the reference value is not greater than 0.05 μm.

11. A method of producing a mask blank, the method comprising the steps of preparing the glass substrate obtained by the method according to claim 2, and forming a thin film as a transferred pattern on the glass substrate.

12. A method of producing a transfer mask, the method comprising the steps of preparing the mask blank obtained by the method according to claim 11 and patterning the thin film of the mask blank to form a thin film pattern on the glass substrate.

13. A method of producing a semiconductor device, the method comprising the steps of preparing the transfer mask obtained by the method according to claim 12 and transferring the thin film pattern of the transfer mask onto a semiconductor substrate by lithography.

14. A method according to claim 1, wherein said flatness control step, said alkali treatment step, and said polishing step are carried out in this order to thereby make the surface of the glass substrate have a surface roughness Ra of 0.2 nm or less, where the surface roughness Ra is representative of a center-line-mean roughness.

15. A method according to claim 2, wherein said flatness control step, said alkali treatment step, and said polishing step are carried out in this order to thereby make the surface of the glass substrate have a surface roughness Ra of 0.2 nm or less, where the surface roughness Ra is representative of a center-line-mean roughness.

16. A method according to claim 1, wherein said glass substrate makes use of a $SiO_2$—$TiO_2$ glass.

17. A method according to claim 16, wherein concentration of acid used in the acid treatment is 0.05-10 vol %.

18. A method according to claim 2, wherein said glass substrate makes use of a $SiO_2$—$TiO_2$ glass.

19. A method according to claim 18, wherein concentration of alkali used in the alkali treatment is 0.5-10 vol %.

* * * * *